United States Patent
Choi

(10) Patent No.: US 11,127,722 B2
(45) Date of Patent: Sep. 21, 2021

(54) STACK PACKAGES INCLUDING VERTICALLY STACKED SUB-PACKAGES WITH INTERPOSER BRIDGES

(71) Applicant: SK hynix Inc., Icheon-si (KR)

(72) Inventor: Bok Kyu Choi, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/893,009

(22) Filed: Jun. 4, 2020

(65) Prior Publication Data

US 2021/0175218 A1 Jun. 10, 2021

(30) Foreign Application Priority Data

Dec. 10, 2019 (KR) .................. 10-2019-0163362

(51) Int. Cl.
*H01L 25/10* (2006.01)
*H01L 25/07* (2006.01)
*H01L 23/00* (2006.01)

(52) U.S. Cl.
CPC ............ *H01L 25/105* (2013.01); *H01L 24/24* (2013.01); *H01L 24/25* (2013.01); *H01L 2224/24155* (2013.01); *H01L 2224/25175* (2013.01); *H01L 2225/1035* (2013.01); *H01L 2225/1041* (2013.01); *H01L 2225/1058* (2013.01)

(58) Field of Classification Search
CPC .................... H01L 24/24; H01L 24/25; H01L 2224/25175; H01L 2225/1035; H01L 2225/1041; H01L 2225/1058; H01L 25/0652; H01L 25/0655; H01L 23/5381; H01L 23/5226; H01L 2924/3841; H01L 21/486; H01L 2225/06541; H01L 2225/06548; H01L 23/49827; H01L 2224/0237; H01L 2224/02371; H01L 2224/02372; H01L 2224/02379; H01L 24/97; H01L 25/105; H01L 23/66; H01L 25/0657; H01L 23/50; H01L 21/6835; H01L 23/5389; H01L 24/19; H01L 24/82; H01L 24/09; H01L 24/17; H01L 24/73;
(Continued)

(56) References Cited

U.S. PATENT DOCUMENTS 6,492,718 B2 * 12/2002 Ohmori .................. H01L 24/97
257/685
2007/0126122 A1 * 6/2007 Bauer .................. H01L 21/6835
257/774
2010/0059898 A1 * 3/2010 Keeth .................... H01L 23/66
257/777

FOREIGN PATENT DOCUMENTS

KR 1020140095182 A 8/2014
KR 1020160052738 A 5/2016

* cited by examiner

*Primary Examiner* — Didarul A Mazumder
(74) *Attorney, Agent, or Firm* — William Park & Associates Ltd.

(57) ABSTRACT

A stack package includes sub-packages vertically stacked. Each of the sub-packages includes a semiconductor chip having a power pad and a signal pad, a first interposer bridge having a signal through via and a second power through via, and a second interposer bridge having a first power through via. Each of the sub-packages further includes a signal redistributed layer pattern extending to electrically connect the signal pad to a signal connection part and a power redistributed layer pattern to electrically connect the power pad to the first and second power through vias. An upper sub-package of the sub-packages is rotated relative to a lower sub-package, and the rotated upper sub-package is stacked on a lower sub-package of the sub-packages.

20 Claims, 13 Drawing Sheets

(58) Field of Classification Search
CPC .............. H01L 23/3114; H01L 23/3121; H01L 23/3128; H01L 23/3135
USPC ........ 257/774; 438/629, 637, 639, 640, 667, 438/668, 672, 675, 700, 701, 713, 978
See application file for complete search history.

STACK PACKAGES INCLUDING VERTICALLY STACKED SUB-PACKAGES WITH INTERPOSER BRIDGES

CROSS-REFERENCE TO RELATED APPLICATIONS

The present application claims priority under 35 U.S.C 119(a) to Korean Application No. 10-2019-0163362, filed on Dec. 10, 2019, which is incorporated herein by references in its entirety.

BACKGROUND

1. Technical Field

The present disclosure relates to package technologies and, more particularly, to stack packages including vertically stacked sub-packages with interposer bridges.

2. Related Art

Recently, techniques for adopting a plurality of semiconductor chips into a single package have been developed to provide fast semiconductor packages with a large capacity of memory. For example, a plurality of semiconductor chips may be two-dimensionally disposed on the same plane to provide a single semiconductor package having a planar stack structure. The planar stack structure may lead to increase of a planar area and a size of the semiconductor package. Accordingly, a lot of effort has been focused on three-dimensionally stacking a plurality of semiconductor chips in a limited planar area to reduce a size of the semiconductor package. That is, advanced techniques for vertically stacking a plurality of semiconductor chips have been proposed to provide compact semiconductor packages.

SUMMARY

According to an embodiment, a stack package includes a first sub-package disposed on a package substrate and a second sub-package vertically stacked on the first sub-package. The first sub-package includes a first semiconductor chip, a first interposer bridge disposed to be laterally spaced apart from the first semiconductor chip and including a first signal through via, and a second interposer bridge disposed at one side of the first semiconductor chip opposite to the first interposer bridge and including a first power through via. The second sub-package includes a second semiconductor chip, a first signal redistributed layer pattern including a first signal connection part that is electrically connected to the first signal through via and is located to overlap with the first signal through via, and a first power redistributed layer pattern including a first power connection part that is electrically connected to the first power through via and is located to overlap with the first power through via.

According to another embodiment, a stack package includes a first sub-package disposed on a package substrate and a second sub-package vertically stacked on the first sub-package. The first and second sub-packages include a semiconductor chip, a first interposer bridge disposed to be laterally spaced apart from the semiconductor chip and including a signal through via and a second power through via, a second interposer bridge disposed at one side of the semiconductor chip opposite to the first interposer bridge and including a first power through via, a signal redistributed layer pattern including a signal connection part that is electrically connected to the signal through via and is located to overlap with the signal through via, and a power redistributed layer pattern including a first power connection part that is electrically connected to the second power through via and is located to overlap with the second power through via and including a second power connection part that is electrically connected to the first power through via and is located to overlap with the first power through via. The semiconductor chip includes a first edge facing the second interposer bridge, a second edge facing the first interposer bridge, a first region located between the first and second edges, a connection region located between the first region and the first edge, a first power pad and a signal pad disposed on the first region, a second region located between the first region and the second edge, and a second power pad disposed on the second region. The signal redistributed layer pattern extends from the first region onto the connection region to electrically connect the signal pad to the signal connection part. The power redistributed layer pattern extends from the first region past the first and second edges to the first and second power connection parts to electrically connect the first power pad to the second power pad as well as the first and second power connection parts. The second sub-package is rotated relative to the first sub-package, and the rotated second sub-package is stacked on the first sub-package such that the signal connection part of the second sub-package overlaps with the signal through via of the first sub-package and the first power connection part of the second sub-package overlaps with the first power through via of the first sub-package.

According to yet another embodiment, a stack package includes a first sub-package disposed on a package substrate and a second sub-package vertically stacked on the first sub-package. The first and second sub-packages include a semiconductor chip, a first interposer bridge, a second interposer bridge, a signal redistributed layer pattern, and a power redistributed layer pattern. The semiconductor chip includes a power pad and a signal pad. The first interposer bridge is disposed to be laterally spaced apart from the semiconductor chip and includes a signal through via and a second power through via. The second interposer bridge is disposed at one side of the semiconductor chip opposite to the first interposer bridge and includes a first power through via. The signal redistributed layer pattern includes a signal connection part that is electrically connected to the signal through via and is located to overlap with the signal through via. The signal redistributed layer pattern extends to electrically connect the signal pad to the signal connection part. The power redistributed layer pattern includes a first power connection part that is electrically connected to the second power through via and is located to overlap with the second power through via and a second power connection part that is electrically connected to the first power through via and is located to overlap with the first power through via. The power redistributed layer pattern extends to electrically connect the power pad to the first and second power connection parts. The second sub-package is rotated relative to the first sub-package, and the rotated second sub-package is stacked on the first sub-package such that the signal connection part of the second sub-package overlaps with the signal through via of the first sub-package and the first power connection part of the second sub-package overlaps with the first power through via of the first sub-package.

DETAILED DESCRIPTION

Figure 1:
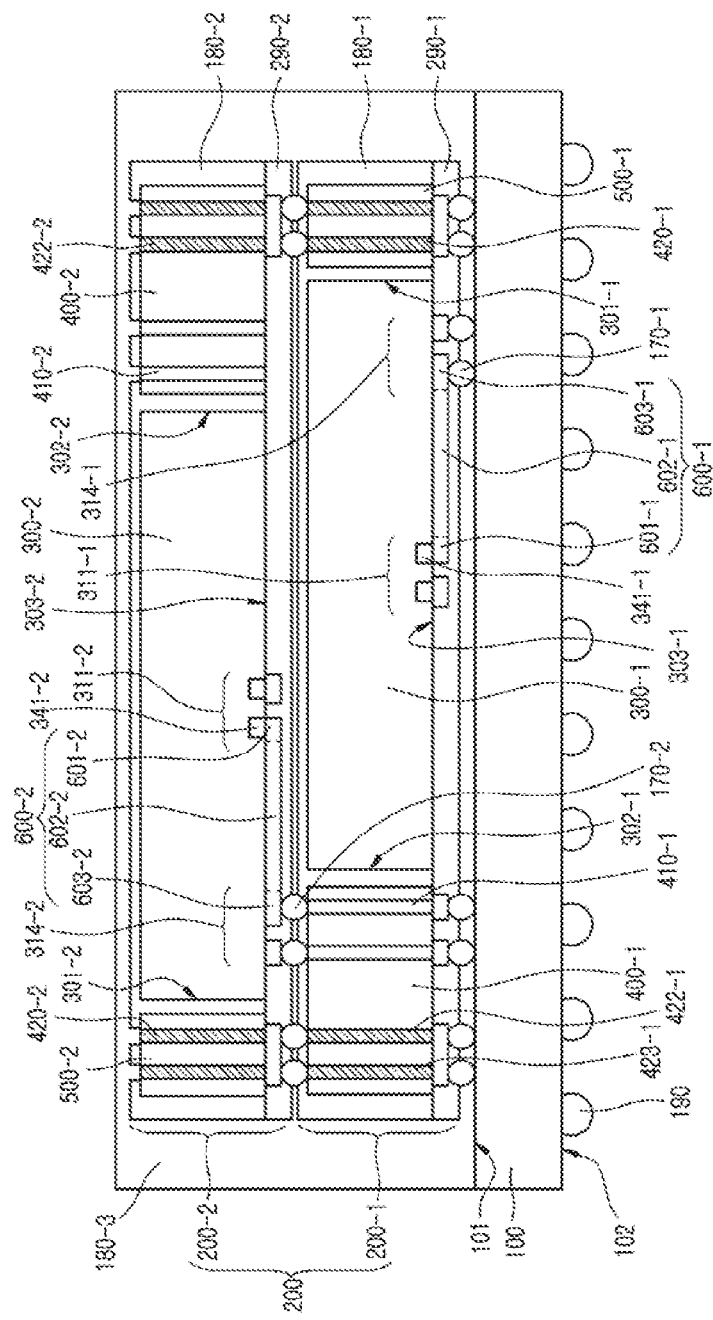
FIGS. 1 and 2 are cross-sectional views illustrating a stack package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A stack package may correspond to a semiconductor package, and the semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips, or application specific integrated circuits (ASIC) chips. The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The semiconductor package may be employed in communication systems such as mobile phones, electronic systems associated with biotechnology or health care, or wearable electronic systems. The semiconductor packages may be applicable to Internet of things (IoT).

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
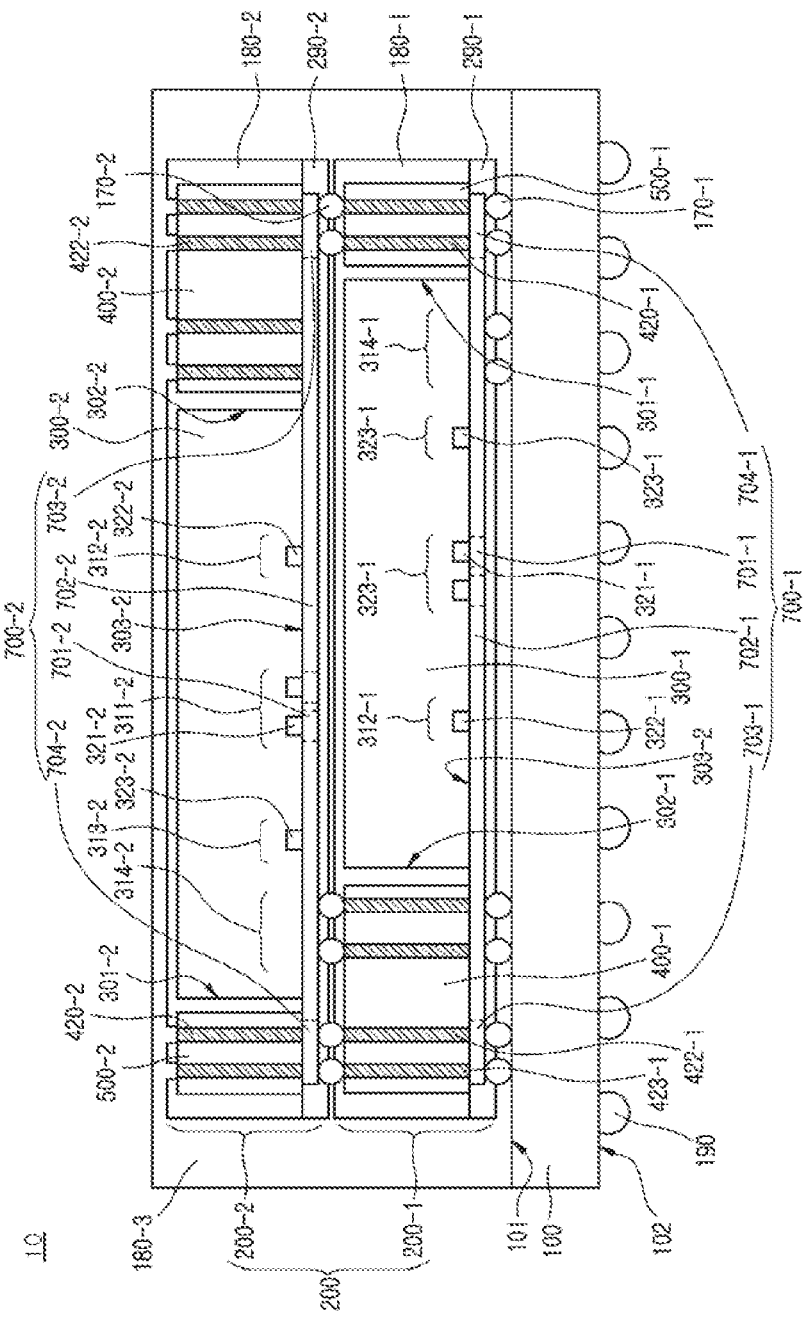

FIGS. 1 and 2 are cross-sectional views illustrating a stack package 10 according to an embodiment. FIG. 1 is a cross-sectional view taken along an extension direction of first signal redistributed layer patterns 600-2 included in the stack package 10. FIG. 2 is a cross-sectional view taken along an extension direction of first power redistributed layer patterns 700-2 included in the stack package 10.

Referring to FIGS. 1 and 2, the stack package 10 may be configured to include a package substrate 100 and a plurality of sub-packages 200. The plurality of sub-packages 200 may include a first sub-package 200-1 and a second sub-package 200-2. In an embodiment, the first sub-package 200-1 may be disposed on a first surface 101 of the package substrate 100, and the second sub-package 200-2 may be disposed on a surface of the first sub-package 200-1 opposite to the package substrate 100. Accordingly, the first and second sub-packages 200-1 and 200-2 may be sequentially and vertically stacked on the first surface 101 of the package substrate 100.

In an embodiment, the sub-packages 200 may have the same configuration. For example, the first and second sub-packages 200-1 and 200-2 may have substantially the same components. The second sub-package 200-2 may have substantially the same plan view as the first sub-package 200-1 is rotated by 180 degrees. That is, the first sub-package 200-1 may have substantially the same plan view as the second sub-package 200-2 is rotated by 180 degrees.

The package substrate 100 may have the first surface 101 and a second surface 102 which are opposite to each other. Outer connectors 190 may be disposed on the second surface 102 to connect the stack package 10 to an external device or an external system. The outer connectors 190 may be connection members such as solder balls. The package substrate 100 may be an interconnection member for electrically connecting the first and second sub-packages 200-1 and 200-2 to an external electronic system or an external module board. In an embodiment, the package substrate 100 may be a printed circuit board (PCB).

The stack package 10 may further include a third encapsulant 180-3 that covers the first surface 101 of the package substrate 100 and protects a stack structure of the first and second sub-packages 200-1 and 200-2. The third encapsulant 180-3 may include various encapsulating materials. The third encapsulant 180-3 may be formed of an epoxy molding compound (EMC) material.

Referring to FIG. 1, the first sub-package 200-1 may be configured to include a first semiconductor chip 300-1, a first interposer bridge 400-1, a second interposer bridge 500-1, a first encapsulant 180-1, and second signal redistributed layer patterns 600-1. The first encapsulant 180-1 may be disposed to cover the first semiconductor chip 300-1, the first interposer bridge 400-1, and the second interposer bridge 500-1. The first encapsulant 180-1 may be formed of an epoxy molding compound (EMC) material.

Referring to FIG. 2, the first sub-package 200-1 may further include second power redistributed layer patterns 700-1. As illustrated in FIGS. 1 and 2, the second sub-package 200-2 may include the first power redistributed layer patterns 700-2 and the first signal redistributed layer patterns 600-2. The second signal redistributed layer patterns 600-1 and the second power redistributed layer patterns 700-1 of the first sub-package 200-1 may be members corresponding to the first signal redistributed layer patterns 600-2 and the first power redistributed layer patterns 700-2 of the second sub-package 200-2. The first signal redistributed layer patterns 600-2 of the second sub-package 200-2 may be conductive patterns having substantially the same shape as the second signal redistributed layer patterns 600-1 of the first sub-package 200-1, and the first power redistributed layer patterns 700-2 of the second sub-package 200-2 may be conductive patterns having substantially the same shape as the second power redistributed layer patterns 700-1 of the first sub-package 200-1.

Figure 3:
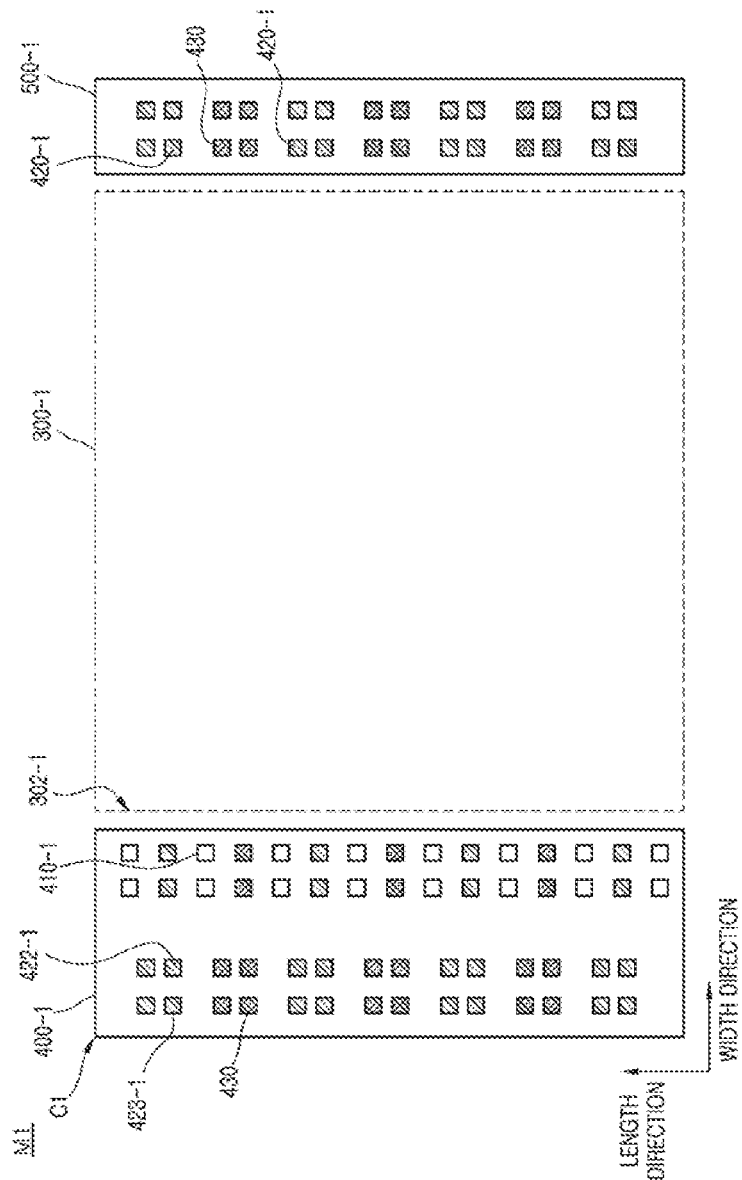
FIG. 3 is a plan view illustrating a layout of interposer bridges included in a first sub-package of the stack package shown in FIG. 1.

FIG. 3 is a plan view illustrating a layout M1 of the first and second interposer bridges 400-1 and 500-1 included in the first sub-package 200-1 of the stack package 10 shown in FIGS. 1 and 2.

Referring to FIGS. 1 and 3, the first and second interposer bridges 400-1 and 500-1 may be disposed to be laterally spaced apart from each other. The first semiconductor chip 300-1 may be disposed between the first and second interposer bridges 400-1 and 500-1. Accordingly, the first interposer bridge 400-1 may be located at one side of the first semiconductor chip 300-1 opposite to the second interposer bridge 500-1, and the second interposer bridge 500-1 may be located at another side of the first semiconductor chip 300-1 opposite to the first interposer bridge 400-1.

The first interposer bridge 400-1 may be configured to include first signal through vias 410-1. The first signal through vias 410-1 may be conductive vias. The first signal through vias 410-1 may be through silicon vias (TSVs) vertically penetrating a body of the first interposer bridge 400-1. The body of the first interposer bridge 400-1 may have a shape of a silicon die or a silicon chip. The first signal through vias 410-1 may be disposed in the body of the first interposer bridge 400-1.

The first signal through vias 410-1 may be formed of a conductive material such as a copper material. Because the first signal through vias 410-1 are able to be formed using a TSV technique, it may be possible to increase the number of the first signal through vias 410-1 disposed in a limited planar area of the first interposer bridge 400-1. In order to more increase the number of the first signal through vias 410-1 disposed in a limited planar area of the first interposer bridge 400-1, the first signal through vias 410-1 may be arrayed in two or more columns which are parallel with a length direction of the first interposer bridge 400-1.

The first signal through vias 410-1 may be connection members providing paths that supply electrical signals to the second sub-package 200-2. The first interposer bridge 400-1 may be a connection member providing electrical signal paths between the second sub-package 200-2 and the package substrate 100 using the first signal through vias 410-1.

The second interposer bridge 500-1 may be configured to include first power through vias 420-1. The first power through vias 420-1 may be formed using a TSV technique. The first power through vias 420-1 may be disposed in a body of the second interposer bridge 500-1. The first power through vias 420-1 may be classified into some groups, and the groups of the first power through vias 420-1 may be disposed to be spaced apart from each other along a length direction of the second interposer bridge 500-1. For example, each of the groups of the first power through vias 420-1 may include four of the first power through vias 420-1. The first power through vias 420-1 may be connection members providing power paths that supply a power supply voltage to the second sub-package 200-2.

Ground through vias 430 may be additionally disposed between the groups of the first power through vias 420-1 arrayed in a length direction of the second interposer bridge 500-1. The ground through vias 430 may also be classified into some groups, and each of the groups of the ground through vias 430 may be disposed between two adjacent groups of the first power through vias 420-1. The ground through vias 430 may be connection members providing ground paths that supply a ground voltage to the second sub-package 200-2. The ground through vias 430 may be disposed in a body of the second interposer bridge 500-1. The groups of the ground through vias 430 may be disposed to be spaced apart from each other along a length direction of the second interposer bridge 500-1. For example, each of the groups of the ground through vias 430 may include four of the ground through vias 430. The second interposer bridge 500-1 may be a connection member providing power paths and ground paths that supply a power supply voltage and a ground voltage to the second sub-package 200-2 using the first power through vias 420-1 and the ground through vias 430.

Second power through vias 422-1 may be additionally disposed in a body of the first interposer bridge 400-1. Third power through vias 423-1 may be additionally disposed to be adjacent to the second power through vias 422-1. The second power through vias 422-1 and the third power through vias 423-1 may be comprised of a plurality of groups, and each of the groups may include one of the second power through vias 422-1 and three of the third power through vias 423-1 adjacent to the one of the second power through vias 422-1. The groups of the second power through vias 422-1 and the third power through vias 423-1 may be disposed to be spaced apart from each other in a length direction of the first interposer bridge 400-1. The groups of the second and third power through vias 422-1 and 423-1 and the groups of the ground through vias 430 may be alternately arrayed in a length direction of the first interposer bridge 400-1.

A distance between the first semiconductor chip 300-1 and an array of the second power through vias 422-1 may be greater than a distance between the first semiconductor chip 300-1 and an array of the first signal through vias 410-1. The first signal through vias 410-1 may be arrayed in two columns when viewed from a plan view of the first interposer bridge 400-1, and the second and third power through vias 422-1 and 423-1 and the ground through vias 430 may be arrayed in two columns when viewed from a plan view of the first interposer bridge 400-1. In such a case, an array of the first signal through vias 410-1 may be disposed between the first semiconductor chip 300-1 and an array of the second and third power through vias 422-1 and 423-1 and the ground through vias 430. As such, the first signal through vias 410-1, the second and third power through vias 422-1 and 423-1, and the ground through vias 430 may be disposed in a body of the first interposer bridge 400-1, and the first power through vias 420-1 and the ground through vias 430 may be disposed in a body of the second interposer bridge 500-1.

As described above, the number of the through vias disposed in a body of the second interposer bridge 500-1 may be different from the number of the through vias disposed in a body of the first interposer bridge 400-1, and an array configuration of the through vias disposed in a body of the second interposer bridge 500-1 may also be different from an array configuration of the through vias disposed in a body of the first interposer bridge 400-1. Accordingly, the first interposer bridge 400-1 and the second interposer bridge 500-1 may have different widths from each other. For example, a width of the second interposer bridge 500-1 may be less than a width of the first interposer bridge 400-1.

Referring again to FIG. 1, the second sub-package 200-2 may be configured to include a second semiconductor chip 300-2, a third interposer bridge 400-2, a fourth interposer bridge 500-2, a second encapsulant 180-2, and the first signal redistributed layer patterns 600-2. Referring to FIG. 2, the second sub-package 200-2 may be configured to further include the first power redistributed layer patterns 700-2. The second encapsulant 180-2 may be disposed to cover the second semiconductor chip 300-2, the third interposer bridge 400-2, and the fourth interposer bridge 500-2. The second encapsulant 180-2 may be formed of an epoxy molding compound (EMC) material.

Figure 4:
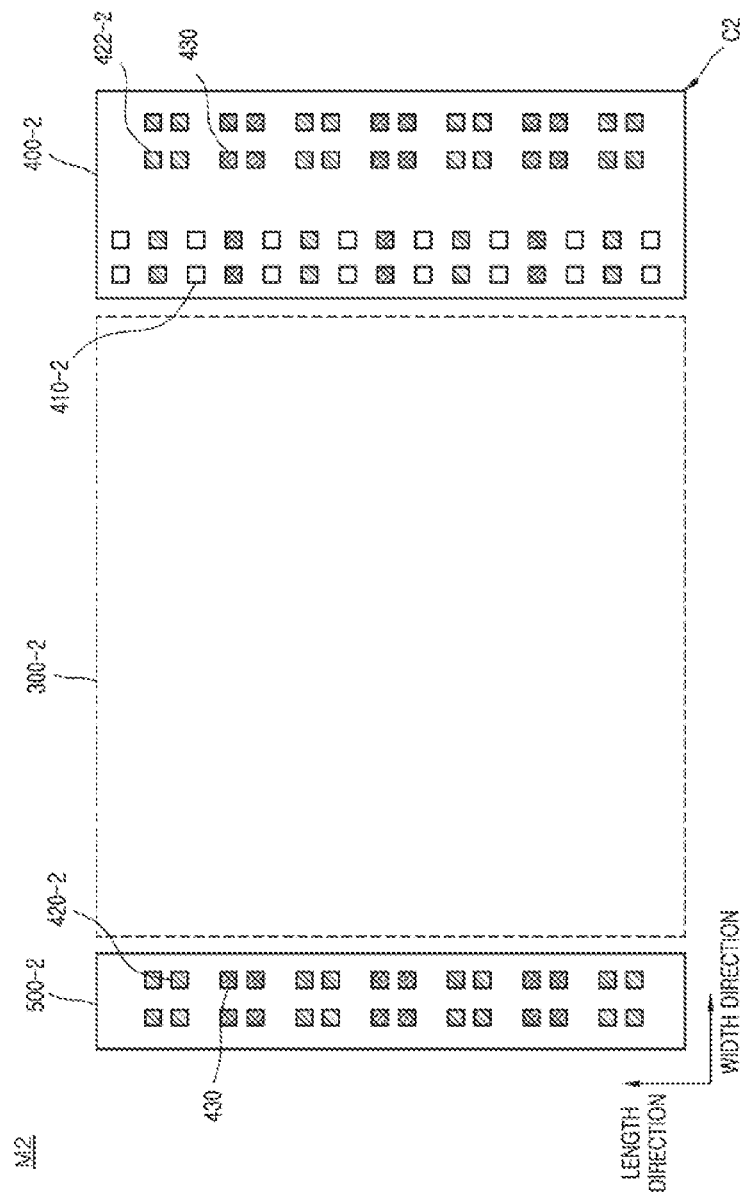
FIG. 4 is a plan view illustrating a layout of interposer bridges included in a second sub-package of the stack package shown in FIG. 1.

FIG. 4 is a plan view illustrating a layout M2 of the interposer bridges 400-2 and 500-2 included in the second sub-package 200-2 of the stack package 10 shown in FIGS. 1 and 2.

Referring to FIGS. 1 and 4, the third interposer bridge 400-2 and the fourth interposer bridge 500-2 may be disposed to be laterally spaced apart from each other. The second semiconductor chip 300-2 may be disposed between the third and fourth interposer bridges 400-2 and 500-2. Accordingly, the third interposer bridge 400-2 may be located at one side of the second semiconductor chip 300-2 opposite to the fourth interposer bridge 500-2, and the fourth interposer bridge 500-2 may be located at another side of the second semiconductor chip 300-2 opposite to the third interposer bridge 400-2.

The third interposer bridge 400-2 may be disposed such that a portion of the third interposer bridge 400-2 vertically overlaps with the second interposer bridge 500-1 of the first sub-package 200-1. The fourth interposer bridge 500-2 may be disposed to vertically overlap with a portion of the first interposer bridge 400-1 of the first sub-package 200-1.

The third interposer bridge 400-2 may be configured to include second signal through vias 410-2, fifth power through vias 422-2, and the ground through vias 430. The second signal through vias 410-2 of the third interposer bridge 400-2 may be members corresponding to the first signal through vias 410-1 of the first interposer bridge 400-1. The fifth power through vias 422-2 of the third interposer bridge 400-2 may be members corresponding to the second power through vias 422-1 of the first interposer bridge 400-1.

The fourth interposer bridge 500-2 may be configured to include fourth power through vias 420-2 and the ground through vias 430. The fourth power through vias 420-2 of the fourth interposer bridge 500-2 may be members corresponding to the first power through vias 420-1 of the second interposer bridge 500-1.

The third interposer bridge 400-2 may be a member having substantially the same configuration as the first interposer bridge 400-1 of the first sub-package 200-1. The fourth interposer bridge 500-2 may be a member having substantially the same configuration as the second interposer bridge 500-1 of the first sub-package 200-1.

In an embodiment, a layout obtained by rotating the first and second interposer bridges 400-1 and 500-1 of FIG. 3 by 180 degrees using a central point of the second sub-package 200-2 as an axis of rotation may be substantially the same as the layout M2 of the third and fourth interposer bridges 400-2 and 500-2 illustrated in FIG. 4. That is, if the layout M1 of the first and second interposer bridges 400-1 and 500-1 illustrated in FIG. 3 is rotated by 180 degrees such that a reference corner C1 of the layout M1 is located at a reference corner C2 of the layout M2 illustrated in FIG. 4, the layout M2 illustrated in FIG. 4 may be obtained.

Figure 5:
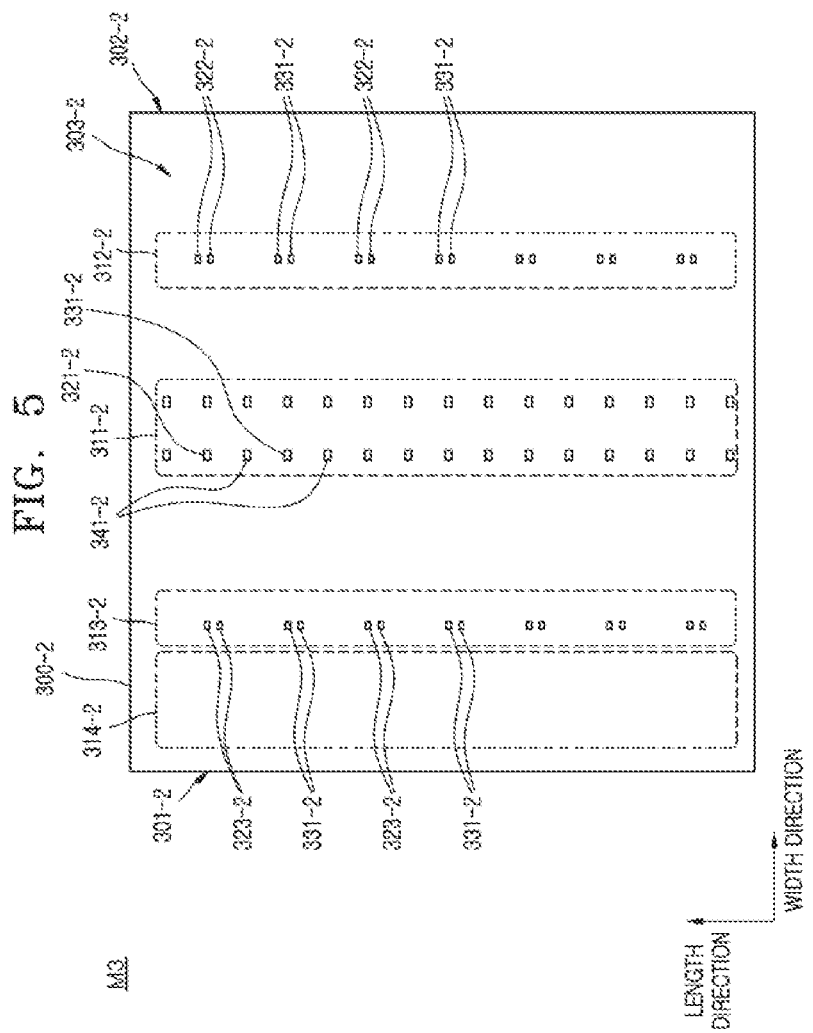
FIG. 5 is a plan view illustrating a layout of chip pads included in a second semiconductor chip of the stack package shown in FIG. 1.

FIG. 5 is a plan view illustrating a layout M3 of chip pads included in the second semiconductor chip 300-2 of the stack package 10 shown in FIG. 1.

Referring to FIGS. 1 and 5, the second semiconductor chip 300-2 may have a first edge 301-2 and a second edge 302-2 which are opposite to each other. The second edge 302-2 of the second semiconductor chip 300-2 may be located at an opposite side of the first edge 301-2. The second semiconductor chip 300-2 may have a surface 303-2 which is defined by the first and second edges 301-2 and 302-2. The surface 303-2 of the second semiconductor chip 300-2 may include a first region 311-2, a second region 312-2, a third region 313-2, and a first connection region 314-2. The first region 311-2, the second region 312-2, the third region 313-2, and the first connection region 314-2 may be set as separate regions which are spaced apart from each other.

The first region 311-2 of the second semiconductor chip 300-2 may be located between the first edge 301-2 and the second edge 302-2. The first edge 301-2 of the second semiconductor chip 300-2 may be located to overlap with a portion of the first interposer bridge 400-1 of the first sub-package 200-1. The first edge 301-2 of the second semiconductor chip 300-2 may be located to overlap with a region between an array of the first signal through vias 410-1 and an array of the second power through vias 422-1 of the first interposer bridge 400-1. That is, the second semiconductor chip 300-2 may be stacked on the first semiconductor chip 300-1 and may be laterally offset relative to the first semiconductor chip 300-1 such that a portion of the second semiconductor chip 300-2 protrudes from a fourth edge 302-1 of the first semiconductor chip 300-1 in a plan view. The second semiconductor chip 300-2 may be laterally offset relative to the first semiconductor chip 300-1 such that the first edge 301-2 of the second semiconductor chip 300-2 protrudes from the fourth edge 302-1 of the first semiconductor chip 300-1 in a plan view. The second edge 302-2 of the second semiconductor chip 300-2 may be located to overlap with the first semiconductor chip 300-1. The second semiconductor chip 300-2 may be laterally offset relative to the first semiconductor chip 300-1 to provide a step structure.

The first region 311-2 of the second semiconductor chip 300-2 may be a central region which is spaced apart from the first edge 301-2 and the second edge 302-2 by the same distance. When the second semiconductor chip 300-2 is a DRAM chip, the first region 311-2 of the second semiconductor chip 300-2 may overlap with a peripheral region of the DRAM chip.

The second region 312-2 of the second semiconductor chip 300-2 may be located between the first region 311-2 and the second edge 302-2. The second region 312-2 of the second semiconductor chip 300-2 may be located to be spaced apart from the first region 311-2 and may also be located to be spaced apart from the second edge 302-2. A distance between the second region 312-2 and the second edge 302-2 may be less than a distance between the second region 312-2 and the first region 311-2.

The third region 313-2 of the second semiconductor chip 300-2 may be located between the first region 311-2 and the first edge 301-2. The third region 313-2 of the second semiconductor chip 300-2 may be located to be spaced apart from the first region 311-2 and may also be located to be spaced apart from the first edge 301-2.

The second semiconductor chip 300-2 may include chip pads disposed on the surface 303-2, and the chip pads disposed on the surface 303-2 may act as connection terminals for electrically connecting the second semiconductor chip 300-2 to another element. The chip pads may be disposed on all of the first, second and third regions 311-2, 312-2 and 313-2. The chip pads disposed on the surface 303 may include power pads for applying a power supply voltage to the second semiconductor chip 300-2, signal pads for transmitting various signals to the second semiconductor chip 300-2, and ground pads for applying a ground voltage to the second semiconductor chip 300-2.

First power pads 321-2, first signal pads 341-2, and ground pads 331-2 of the chip pads may be disposed on the first region 311-2 of the second semiconductor chip 300-2. The first power pads 321-2, the first signal pads 341-2, and the ground pads 331-2 may be arrayed in a first column parallel with a length direction of the first region 311-2 in order of the first power pad 321-2, the first signal pad 341-2, the ground pad 331-2, and the first signal pad 341-2. The length direction of the first region 311-2 may be the same direction as the first edge 301-2 extends. A second column may also be located to be parallel with the first column. Other first power pads, other first signal pads, and other ground pads may also be arrayed in the second column on the first region 311-2.

As described above, because the first power pad 321-2, the first signal pad 341-2, and the ground pad 331-2 are disposed to be adjacent to each other, routing lengths of data lines, power lines, and ground lines may be reduced. Accordingly, an operation speed of the second semiconductor chip 300-2 may be improved. The second semiconductor chip 300-2 may include internal integration circuits to which a power voltage, data signals, and a ground voltage are applied. Because the first power pad 321-2, the first signal pad 341-2, and the ground pad 331-2 are disposed to be adjacent to each other, it may be possible to reduce the routing lengths of the data lines transmitting data to the internal integration circuits, the power lines supplying a power voltage to the internal integration circuits, and the ground lines supplying a ground voltage to the internal integration circuits. Thus, a delay time of the data signals applied to or outputted from the internal integration circuits may be reduced to improve an operation speed of the internal integration circuits.

Second power pads 322-2 may be disposed on the second region 312-2 of the second semiconductor chip 300-2. Additional ground pads 331-2 may also be disposed on the second region 312-2 of the second semiconductor chip 300-2. Groups of the second power pads 322-2 and groups of the additional ground pads 331-2 may be alternately arrayed along a length direction of the second region 312-2.

Third power pads 323-2 may be disposed on the third region 313-2 of the second semiconductor chip 300-2. The additional ground pads 331-2 may also be disposed on the third region 313-2 of the second semiconductor chip 300-2. Groups of the third power pads 323-2 and groups of the additional ground pads 331-2 may be alternately arrayed along a length direction of the third region 313-2.

The first connection region 314-2 may be defined as a portion of the surface 303-2 of the second semiconductor chip 300-2. The first connection region 314-2 may be located between the first region 311-2 and the first edge 301-2 of the second semiconductor chip 300-2. The first connection region 314-2 may include a region being disposed to overlap with the first signal through vias 410-1 or being connected to the first signal through vias 410-1. The first connection region 314-2 of the second semiconductor chip 300-2 may be a region connected to the first interposer bridge 400-1. The first connection region 314-2 of the second semiconductor chip 300-2 may overlap with a portion of the first interposer bridge 400-1. Referring to FIGS. 1 and 2, the first region 311-2 and the third region 313-2 of the second semiconductor chip 300-2 may overlap with the first semiconductor chip 300-1.

The first connection region 314-2 of the second semiconductor chip 300-2 may be disposed to be spaced apart from the first region 311-2 such that a distance between the first connection region 314-2 and the first edge 301-2 is less than a distance between the first connection region 314-2 and the first region 311-2. The first connection region 314-2 may be located between the first edge 301-2 and the third region 313-2. A distance between the first connection region 314-2 and the first edge 301-2 may be less than a distance between the first connection region 314-2 and the third region 313-2.

Figure 6:
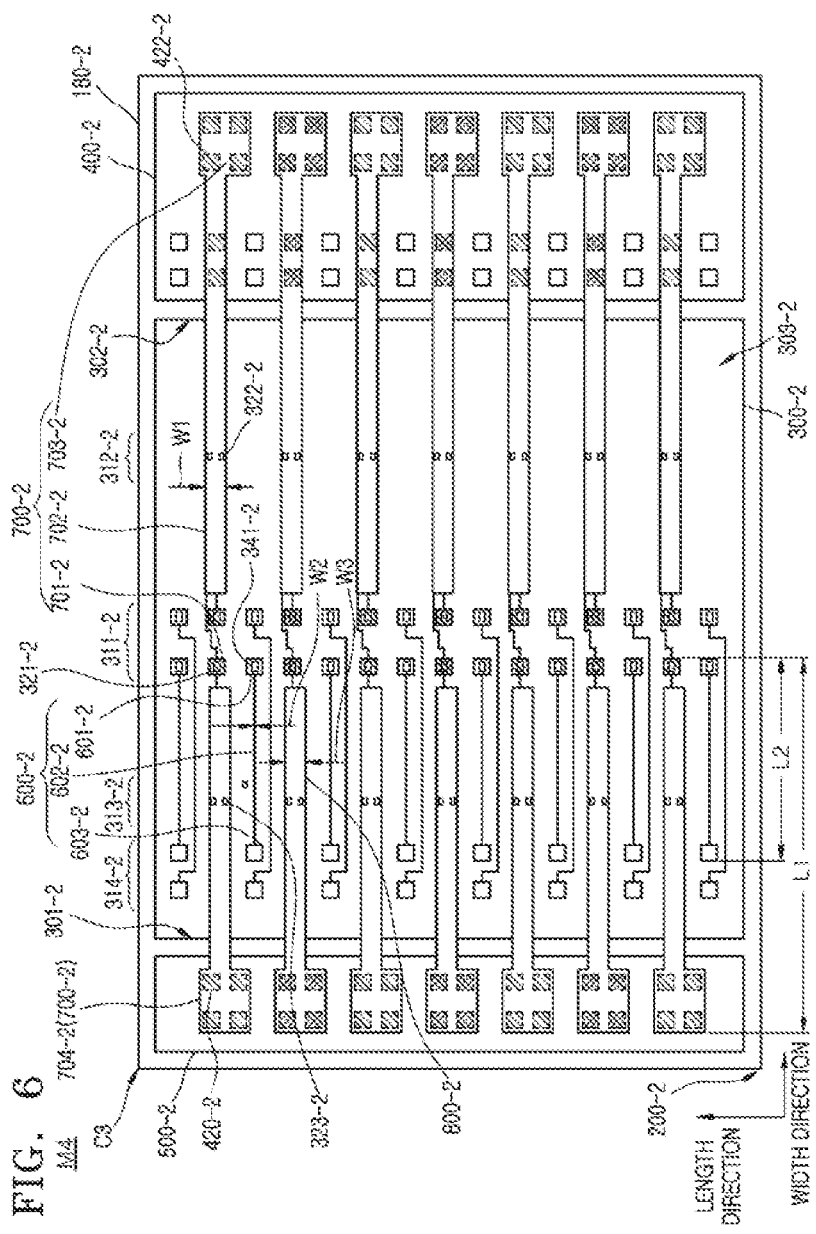
FIG. 6 is a plan view illustrating a layout of redistributed layer patterns included in a second sub-package of the stack package shown in FIG. 1.

FIG. 6 is a plan view illustrating a layout M4 of the first signal redistributed layer patterns 600-2 and the first power redistributed layer patterns 700-2 included in the second sub-package 200-2 of the stack package 10 shown in FIGS. 1 and 2.

Referring to FIGS. 1, 2, and 6, the second sub-package 200-2 may include the first signal redistributed layer patterns 600-2 disposed on the surface 303-2 of the second semiconductor chip 300-2. The second sub-package 200-2 may also include the first power redistributed layer patterns 700-2 extending from the surface 303-2 of the second semiconductor chip 300-2 onto a surface of the third interposer bridge 400-2. The first power redistributed layer patterns 700-2 may farther extend onto a surface of the fourth interposer bridge 500-2. The second sub-package 200-2 may further include ground redistributed layer patterns 800-2 extending from the surface 303-2 of the second semiconductor chip 300-2 onto a surface of the third interposer bridge 400-2. The ground redistributed layer patterns 800-2 may farther extend onto a surface of the fourth interposer bridge 500-2.

The first power redistributed layer patterns 700-2, groups of the first signal redistributed layer patterns 600-2, and the ground redistributed layer patterns 800-2 may be alternately arrayed in order of the first power redistributed layer pattern 700-2, one group of the first signal redistributed layer patterns 600-2, the ground redistributed layer pattern 800-2, and the first power redistributed layer pattern 700-2.

The first signal redistributed layer patterns 600-2 may provide paths applying data signals to the second semiconductor chip 300-2, and the first power redistributed layer patterns 700-2 may provide paths supplying a power supply voltage to the second semiconductor chip 300-2. The ground redistributed layer patterns 800-2 may provide paths supplying a ground voltage to the second semiconductor chip 300-2.

Referring again to FIGS. 1 and 6, each of the first signal redistributed layer patterns 600-2 may be a conductive pattern including a pad overlap part 601-2, a first signal connection part 603-2, and an extension part 602-2. The pad overlap parts 601-2 of the first signal redistributed layer patterns 600-2 may be located to overlap with respective ones of the first signal pads 341-2 of the second semiconductor chip 300-2 and may be electrically connected to respective ones of the first signal pads 341-2 of the second semiconductor chip 300-2.

The first signal connection parts 603-2 of the first signal redistributed layer patterns 600-2 may be electrically connected to respective ones of the first signal through vias 410-1 of the first interposer bridge 400-1 included in the first sub-package 200-1. The first signal redistributed layer patterns 600-2 may extend onto the first connection region 314-2 located on the first signal through vias 410-1 such that the first signal connection parts 603-2 of the first signal redistributed layer patterns 600-2 overlap with respective ones of the first signal through vias 410-1. The extension parts 602-2 of the first signal redistributed layer patterns 600-2 may extend from the first region 311-2 onto the first connection region 314-2 to electrically connect the pad overlap parts 601-2 to respective ones of the first signal connection parts 603-2. The first signal redistributed layer patterns 600-2 may extend to electrically connect the first signal pads 341-2 to respective ones of the first signal connection parts 603-2.

Referring to FIGS. 2 and 6, each of the first power redistributed layer patterns 700-2 may be a conductive pattern including a pad overlap part 701-2, a first power connection part 703-2, a second power connection part 704-2, and an extension part 702-2. The pad overlap parts 701-2 of the first power redistributed layer patterns 700-2 may be located to overlap with respective ones of the first power pads 321-2 of the second semiconductor chip 300-2 and may be electrically connected to respective ones of the first power pads 321-2 of the second semiconductor chip 300-2.

The first power connection parts 703-2 of the first power redistributed layer patterns 700-2 may be electrically connected to the first power through vias 420-1 of the second interposer bridge 500-1 included in the first sub-package 200-1. The first power connection parts 703-2 of the first power redistributed layer patterns 700-2 may be located to overlap with the first power through vias 420-1. The first power redistributed layer patterns 700-2 may extend from the first region 311-2 of the second semiconductor chip 300-2 to overlap with the first power through vias 420-1. The extension parts 702-2 of the first power redistributed layer patterns 700-2 may extend from the first region 311-2 to pass over the second region 312-2 and the second edge 302-2.

The extension parts 702-2 of the first power redistributed layer patterns 700-2 may farther extend to pass over a surface of the second encapsulant 180-2 and may reach and contact the first power connection parts 703-2 which are electrically connected to the fifth power through vias 422-2 of the third interposer bridge 400-2.

The extension parts 702-2 of the first power redistributed layer patterns 700-2 may pass over the second region 312-2 to electrically connect the first power pads 321-2 in the first region 311-2 to the second power pads 322-2 in the second region 312-2.

The extension parts 702-2 of the first power redistributed layer patterns 700-2 may farther extend from the first region 311-2 toward the first edge 301-2 such that the first power pads 321-2 in the first region 311-2 and the second power pads 322-2 in the second region 312-2 are electrically connected to the third power pads 323-2 in the third region 313-2. That is, the extension parts 702-2 of the first power redistributed layer patterns 700-2 may also extend from the first region 311-2 onto the third region 313-2.

The extension parts 702-2 of the first power redistributed layer patterns 700-2 may additionally extend onto the fourth interposer bridge 500-2 such that the second power connection parts 704-2 of the first power redistributed layer patterns 700-2 overlap with the fourth interposer bridge 500-2. The extension parts 702-2 of the first power redistributed layer patterns 700-2 may additionally extend to pass over a surface of the second encapsulant 180-2 adjacent to the first edge 302-1 and to contact the second power connection parts 704-2. The extension parts 702-2 of the first power redistributed layer patterns 700-2 may extend to overlap with the fourth power through vias 420-2 of the fourth interposer bridge 500-2. The second power connection parts 704-2 of the first power redistributed layer patterns 700-2 may be electrically connected to the fourth power through vias 420-2 of the fourth interposer bridge 500-2.

The second power connection parts 704-2 of the first power redistributed layer patterns 700-2 may be located to overlap with the fourth power through vias 420-2 of the fourth interposer bridge 500-2. The second power connection parts 704-2 of the first power redistributed layer patterns 700-2 may be located to overlap with the second power through vias 422-1 of the first interposer bridge 400-1 and may be electrically connected to the second power through vias 422-1 of the first interposer bridge 400-1.

The first power redistributed layer patterns 700-2 may extend to have a length which is greater than a length of the first signal redistributed layer patterns 600-2. Each of the first power redistributed layer patterns 700-2 may have a relatively high resistance value and a relatively high impedance value because of its large length. Thus, at least one portion of each of the first power redistributed layer patterns 700-2 may be designed to have a width W1 which is greater than a width W2 of the first signal redistributed layer patterns 600-2, in order to reduce the resistance value and the impedance value thereof. For example, the extension parts 702-2 of the first power redistributed layer patterns 700-2 may be designed to be wider than the extension parts 602-2 of the first signal redistributed layer patterns 600-2. The wide portions of the first power redistributed layer patterns 700-2 may reduce the resistance value and the impedance value of the first power redistributed layer patterns 700-2. The wide portions of the first power redistributed layer patterns 700-2 may offset or compensate for increase of the resistance value or the impedance value of the first power redistributed layer patterns 700-2. Thus, the wide portions of the first power redistributed layer patterns 700-2 may improve a power delivery network.

The second power connection parts 704-2 of the first power redistributed layer patterns 700-2 may be electrically connected to the second power through vias 422-1 as well as the third power through vias 423-1 of the first interposer bridge 400-1. Because the second power through vias 422-1 and the third power through vias 423-1 adjacent to the second power through vias 422-1 are electrically connected to the second power connection parts 704-2 of the first power redistributed layer patterns 700-2, a resistance value and an impedance value of an electrical path from the first power redistributed layer patterns 700-2 to the package substrate 100 may be reduced as compared with a case that the electrical path is comprised of the second power through vias 422-1 without the third power through vias 423-1. Accordingly, the power delivery network may be more improved.

Some of the ground through vias 430 of the second interposer bridge 500-1 illustrated in FIG. 3 may be electrically connected to one of the ground redistributed layer patterns 800-2 illustrated in FIG. 6. Because at least two of the ground through vias 430 are electrically connected to one of the ground redistributed layer patterns 800-2, a resistance value and an impedance value of an electrical path from the ground redistributed layer patterns 800-2 to the package substrate 100 may be reduced as compared with a case that the ground through vias 430 are electrically connected to respective ones of the ground redistributed layer patterns 800-2. Accordingly, the power delivery network may be more improved.

Referring again to FIG. 6, the ground redistributed layer patterns 800-2 may have substantially the same shape as the first power redistributed layer patterns 700-2. Thus, the ground redistributed layer patterns 800-2 may also have a length L1 which is greater than a length L2 of the first signal redistributed layer patterns 600-2. As a result, each of the ground redistributed layer patterns 800-2 may have a relatively high resistance value and a relatively high impedance value because of its large length. Thus, at least one portion of each of the ground redistributed layer patterns 800-2 may be designed to have a width W3 which is greater than a width W1 of the first signal redistributed layer patterns 600-2, in order to reduce the resistance value and the impedance value thereof. The wide portions of the ground redistributed layer patterns 800-2 may reduce the resistance value and the impedance value of the ground redistributed layer patterns 800-2. The wide portions of the ground redistributed layer patterns 800-2 may offset or compensate for increase of the resistance value or the impedance value of the ground redistributed layer patterns 800-2. Thus, the wide portions of the ground redistributed layer patterns 800-2 may improve a power delivery network.

Referring again to FIGS. 1 and 2, the second sub-package 200-2 may further include a second dielectric layer 290-2 that covers the redistributed layer patterns including the first signal redistributed layer patterns 600-2 and the first power redistributed layer patterns 700-2 to electrically insulate and isolate the redistributed layer patterns from each other. The first sub-package 200-1 may further include a first dielectric layer 290-1 that covers the redistributed layer patterns including the second signal redistributed layer patterns 600-1 and the second power redistributed layer patterns 700-1 to electrically insulate and isolate the redistributed layer patterns from each other.

Figure 7:
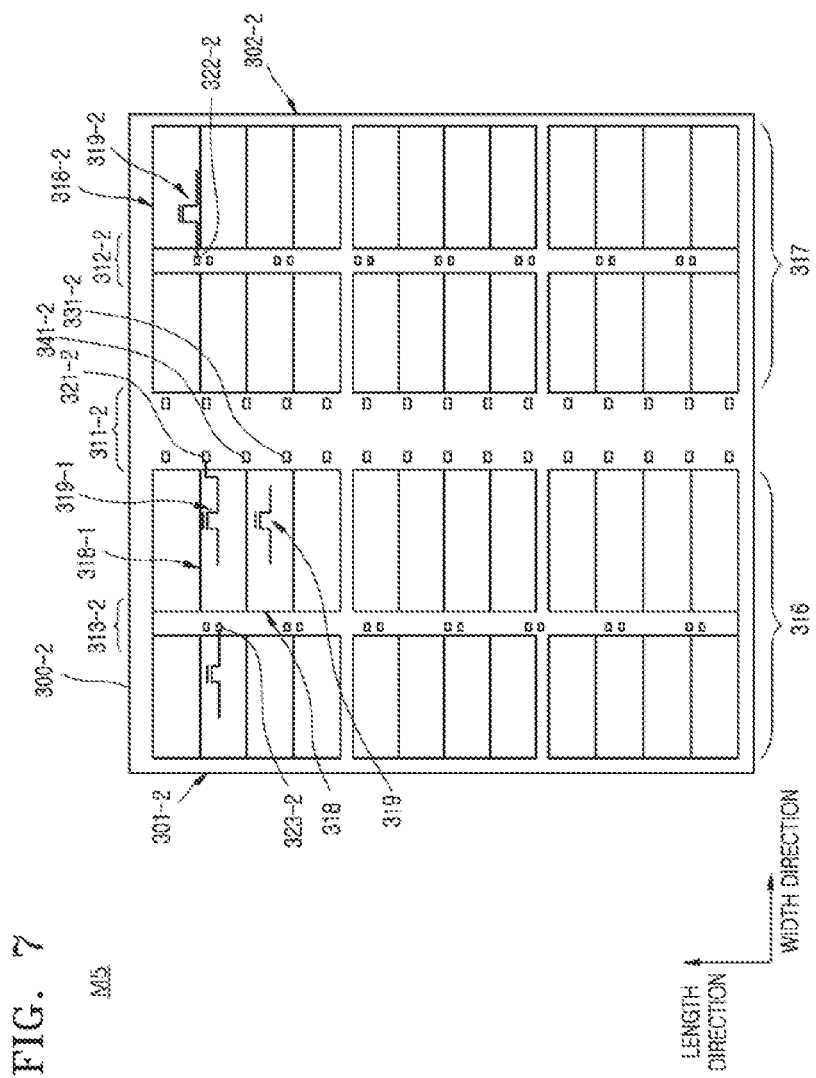
FIG. 7 is a plan view illustrating a layout of cell matrix regions included in a second semiconductor chip of the stack package shown in FIG. 1.

FIG. 7 is a plan view illustrating a layout M5 of cell matrix regions 318 included in the second semiconductor chip 300-2 of the second sub-package 200-2 of the stack package 10 shown in FIG. 1.

Referring to FIGS. 1, 2, 6, and 7, a first core region 316 may be disposed between the first region 311-2 and the first edge 301-2 of the second semiconductor chip 300-2, and a second core region 317 may be disposed between the first region 311-2 and the second edge 302-2 of the second semiconductor chip 300-2. When the second semiconductor chip 300-2 is a DRAM chip, each of the first and second core regions 316 and 317 may be a region in which DRAM cells 319 are arrayed. The first region 311-2 of the second semiconductor chip 300-2 may be a peripheral region in which peripheral circuits for controlling the DRAM cells 319 are disposed. Each of the first and second core regions 316 and 317 may be a region in which a plurality of cell matrix regions 318 are disposed. The cell matrix region 318 may correspond to a memory bank. The layout M5 illustrated in FIG. 7 may be merely an example of the second semiconductor chip 300-2. In an embodiment, 16 memory banks may be arrayed in one column, and 32 memory banks may be disposed in the first core region 316. Each of the DRAM cells 319 disposed in the cell matrix region 318 may include a transistor and a capacitor.

The first power pads 321-2 disposed on the first region 311-2 of the second semiconductor chip 300-1 may be disposed to apply a power supply voltage to first DRAM cells 319-1 located in first cell matrix regions 318-1 disposed to be adjacent to the first region 311-2. The second power pads 322-2 disposed on the second region 312-2 of the second semiconductor chip 300-2 may be disposed to apply the power supply voltage to second DRAM cells 319-2 located in second cell matrix regions 318-2 disposed between the second region 312-2 and the second edge 302-2.

Because the second DRAM cells 319-2 receive the power supply voltage from the second power pads 322-2 located in the second region 312-2, a voltage drop across power lines between the second power pads 322-2 and the second DRAM cells 319-2 may be reduced as compared with a case that the second DRAM cells 319-2 receive the power supply voltage from the first power pads 321-2 located in the first region 311-2. That is, because the second DRAM cells 319-2 receive the power supply voltage from the second power pads 322-2 located in the second region 312-2 adjacent to the second cell matrix region 318-2, the power supply voltage applied to the second DRAM cells 319-2 may be maximized to improve operation characteristics of the second DRAM cells 319-2.

In the same way as described with reference to FIG. 7, additional power pads may also be uniformly disposed even on the second and third regions 312-2 and 313-2 except the first region 311-2 corresponding to the peripheral region. Thus, it may be possible to maximize a level of the power supply voltage applied to all of the DRAM cells 319 of the second semiconductor chip 300-2.

Figure 8:
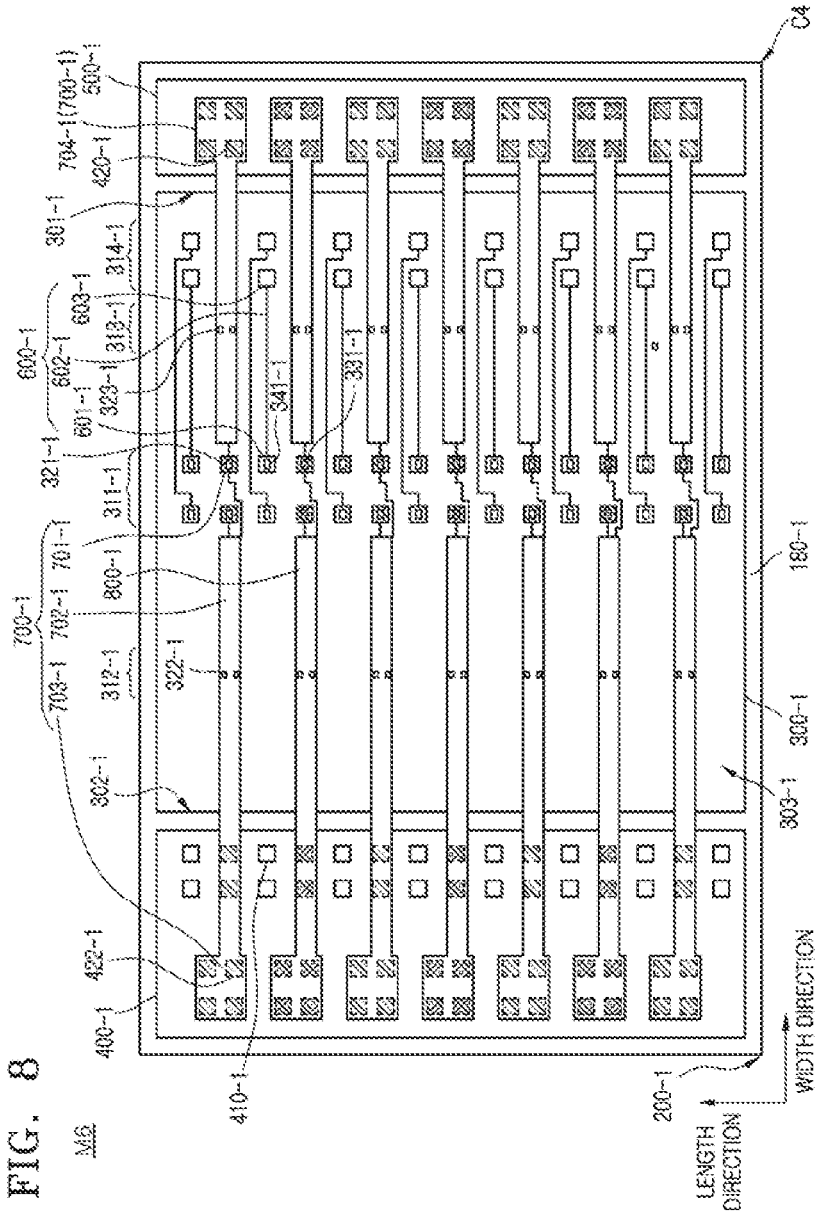
FIG. 8 is a plan view illustrating a layout of redistributed layer patterns included in a first sub-package of the stack package shown in FIG. 1.

FIG. 8 is a plan view illustrating a layout M6 of the second signal redistributed layer patterns 600-1 and the second power redistributed layer patterns 700-1 included in the first sub-package 200-1 of the stack package 10 shown in FIG. 1.

Referring to FIGS. 1, 2, and 8, the first sub-package 200-1 may be configured to further include ground redistributed layer patterns 800-1 in addition to the second signal redistributed layer patterns 600-1 and the second power redistributed layer patterns 700-1. The second signal redistributed layer patterns 600-1, the second power redistributed layer patterns 700-1, and the ground redistributed layer patterns 800-1 of the first sub-package 200-1 may have pattern shapes corresponding to the first signal redistributed layer patterns 600-2, the first power redistributed layer patterns 700-2, and the ground redistributed layer patterns 800-2 of the second sub-package 200-2, respectively.

The layout M6 of the redistributed layer patterns 600-1, 700-1, and 800-1 of the first sub-package 200-1 illustrated in FIG. 8 may be substantially the same shape as the layout M4 of the redistributed layer patterns 600-2, 700-2, and 800-2 of the second sub-package 200-2 illustrated in FIG. 6 is rotated by 180 degrees. That is, if the layout M4 illustrated in FIG. 6 is rotated by 180 degrees such that a reference corner C3 of the layout M4 is located at a reference corner C4 of the layout M6 illustrated in FIG. 8, the layout M6 illustrated in FIG. 8 may be obtained.

In addition, the first semiconductor chip 300-1 of the first sub-package 200-1 may have a chip pad layout corresponding to the chip pads of the second semiconductor chip 300-2 illustrated in FIG. 5. The chip pad layout of the first semiconductor chip 300-1 of the first sub-package 200-1 may be substantially the same layout as the layout M3 of the chip pads of the second semiconductor chip 300-2 illustrated in FIG. 5 is rotated by 180 degrees. Accordingly, the first semiconductor chip 300-1 may have substantially the same configuration as the second semiconductor chip 300-2.

The first semiconductor chip 300-1 may have a third edge 301-1 and a fourth edge 302-1 which are opposite to each other. The fourth edge 302-1 of the first semiconductor chip 300-1 may be located at an opposite side of the third edge 301-1. The third edge 301-1 and the fourth edge 302-1 of the first semiconductor chip 300-1 may correspond to the first edge 301-2 and the second edge 302-2 of the second semiconductor chip 300-2, respectively. The first semiconductor chip 300-1 may have a surface 303-1 which is defined by the third and fourth edges 301-1 and 302-1. The third edge 301-1 of the first semiconductor chip 300-1 may be an edge facing the second interposer bridge 500-1. The fourth edge 302-1 of the first semiconductor chip 300-1 may be an edge facing the first interposer bridge 400-1.

The surface 303-1 of the first semiconductor chip 300-1 may include a fourth region 311-1, a fifth region 312-1, a sixth region 313-1, and a second connection region 314-1. The fourth region 311-1, the fifth region 312-1, the sixth region 313-1, and the second connection region 314-1 of the first semiconductor chip 300-1 may be regions corresponding to the first region 311-2, the second region 312-2, the third region 313-2, and the first connection region 314-2 of the second semiconductor chip 300-2, respectively.

The fourth region 311-1 of the first semiconductor chip 300-1 may be located between the third edge 301-1 and the fourth edge 302-1. The fifth region 312-1 of the first semiconductor chip 300-1 may be located between the fourth region 311-1 and the fourth edge 302-1. The sixth region 313-1 of the first semiconductor chip 300-1 may be located between the fourth region 311-1 and the third edge 301-1.

The second connection region 314-1 may be located between the fourth region 311-1 and the third edge 301-1. The second connection region 314-1 may be a region through which the first semiconductor chip 300-1 is electrically connected to the package substrate 100 without any interposer bridge disposed between the first semiconductor chip 300-1 and the package substrate 100. The second connection region 314-1 of the first semiconductor chip 300-1 may be disposed to be spaced apart from the fourth region 311-1 such that a distance between the second connection region 314-1 and the third edge 301-1 is less than a distance between the second connection region 314-1 and the fourth region 311-1. The second connection region 314-1 of the first semiconductor chip 300-1 may be disposed to be adjacent to the third edge 301-1 such that a distance between the second connection region 314-1 and the third edge 301-1 is less than a distance between the second connection region 314-1 and the sixth region 313-1.

Fourth power pads 321-1, second signal pads 341-1, and ground pads 331-1 may be disposed on the fourth region 311-1 of the first semiconductor chip 300-1. Fifth power pads 322-1 may be additionally disposed on the fifth region 312-1 of the first semiconductor chip 300-1. Sixth power pads 323-1 may be additionally disposed on the sixth region 313-1 of the first semiconductor chip 300-1. The fourth power pads 321-1, the second signal pads 341-1, the ground pads 331-1, the fifth power pads 322-1, and the sixth power pads 323-1 of the first semiconductor chip 300-1 may be chip pads corresponding to the first power pads 321-2, the first signal pads 341-2, the ground pads 331-2, the second power pads 322-2, and the third power pads 323-2 of the second semiconductor chip 300-2 illustrated in FIG. 6, respectively.

Referring to FIGS. 1, 2, and 8, the first sub-package 200-1 may include the second signal redistributed layer patterns 600-1 disposed on the surface 303-1 of the first semiconductor chip 300-1. The first sub-package 200-1 may also include the second power redistributed layer patterns 700-1 extending from the surface 303-1 of the first semiconductor chip 300-1 onto a surface of the first interposer bridge 400-1. The second power redistributed layer patterns 700-1 may farther extend onto a surface of the second interposer bridge 500-1. The first sub-package 200-1 may further include the ground redistributed layer patterns 800-1 extending from the surface 303-1 of the first semiconductor chip 300-1 onto a surface of the first interposer bridge 400-1. The ground redistributed layer patterns 800-1 may farther extend onto a surface of the second interposer bridge 500-1.

Referring again to FIGS. 1 and 8, each of the second signal redistributed layer patterns 600-1 may be a conductive pattern including a pad overlap part 601-1, a second signal connection part 603-1, and an extension part 602-1. The pad overlap part 601-1, the second signal connection part 603-1, and the extension part 602-1 of each of the second signal redistributed layer patterns 600-1 may correspond to the pad overlap part 601-2, the first signal connection part 603-2, and the extension part 602-2 of each of the first signal redistributed layer patterns 600-2, respectively. The pad overlap parts 601-1 of the second signal redistributed layer patterns 600-1 may be located to overlap with respective ones of the second signal pads 341-1 of the first semiconductor chip 300-1 and may be electrically connected to respective ones of the second signal pads 341-1 of the first semiconductor chip 300-1. The second signal connection parts 603-1 of the second signal redistributed layer patterns 600-1 may be electrically connected to the package substrate 100. The second signal redistributed layer patterns 600-1 may extend to electrically connect the second signal pads 341-1 to respective ones of the second signal connection parts 603-1.

Referring to FIGS. 2 and 8, each of the second power redistributed layer patterns 700-1 may be a conductive pattern including a pad overlap part 701-1, a third power connection part 703-1, a fourth power connection part 704-1, and an extension part 702-1. The pad overlap part 701-1, the third power connection part 703-1, the fourth power connection part 704-1, and the extension part 702-1 of each of the second power redistributed layer patterns 700-1 may correspond to the pad overlap part 701-2, the first power connection part 703-2, the second power connection part 704-2, and the extension part 702-2 of each of the first power redistributed layer patterns 700-2, respectively.

The third power connection parts 703-1 may be located to overlap with the second power through vias 422-1 of the first interposer bridge 400-1. The second power redistributed layer patterns 700-1 may extend from the fourth region 311-1 of the first semiconductor chip 300-1 to pass over the fourth edge 302-1 and may reach and contact the third power connection parts 703-1 to electrically connect the fourth power pads 321-1 to the third power connection parts 703-1.

The second power redistributed layer patterns 700-1 may farther extend to electrically connect the fourth power pads 321-1 to the fifth and sixth power pads 322-1 and 323-1. The second power redistributed layer patterns 700-1 may farther extend to electrically connect the fourth power pads 321-1 and the third power connection parts 703-1 to the first power through vias 420-1 and the fourth power connection parts 704-1. The second power redistributed layer patterns 700-1 may farther extend to pass over the fifth region 312-1 and the sixth region 313-1.

Referring again to FIGS. 1 and 2, the stack package 10 may further include first inner connectors 170-1, second inner connectors 170-2, and outer connectors 190. The first sub-package 200-1 may be electrically connected to the package substrate 100 through the first inner connectors 170-1. The second sub-package 200-2 may be electrically connected to the first sub-package 200-1 through the second inner connectors 170-2. The first and second inner connectors 170-1 and 170-2 may be connection members such as conductive bumps.

Figure 9:
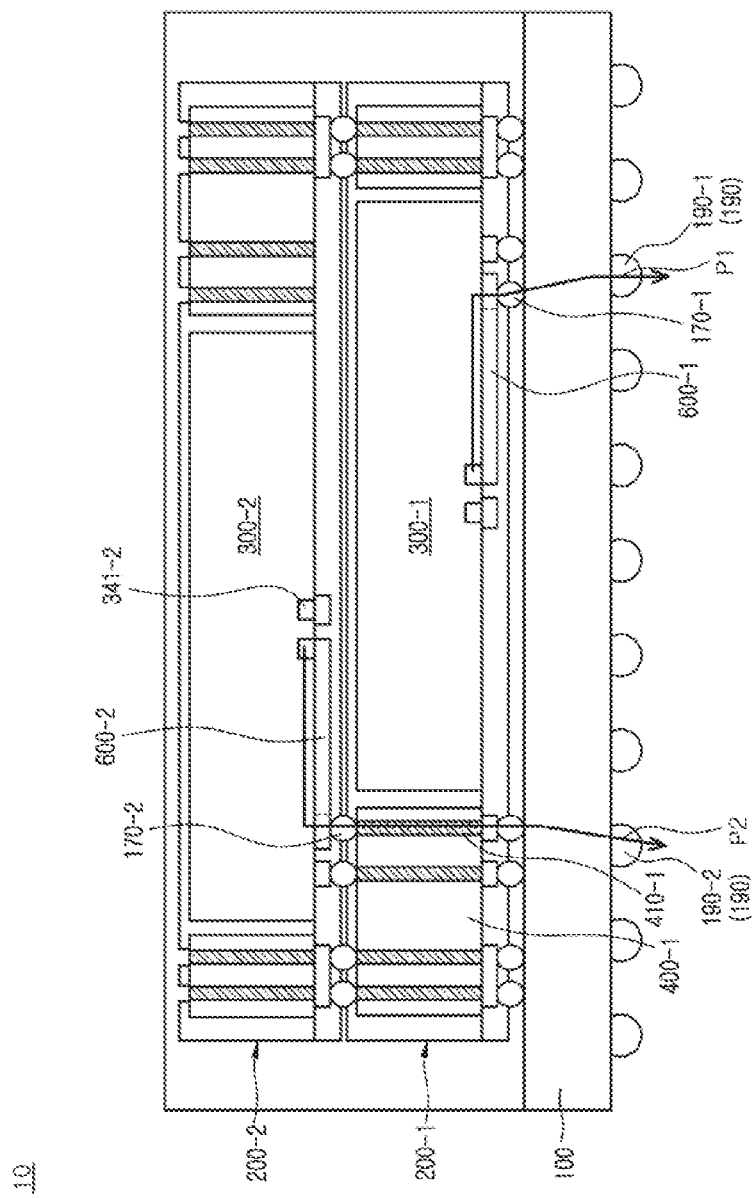
FIG. 9 is a cross-sectional view illustrating signal channels of the stack package shown in FIG. 1.

FIG. 9 is a cross-sectional view illustrating first and second signal channels P1 and P2 of the stack package 10 shown in FIG. 1.

Referring to FIG. 9, the second semiconductor chip 300-2 may communicate with an external device through the second signal channel P2. The second signal channel P2 may be configured to include the first signal redistributed layer patterns 600-2, the second inner connectors 170-2, the first signal through vias 410-1 of the first interposer bridge 400-1, the package substrate 100, and second outer connectors 190-2 of the outer connectors 190. The first semiconductor chip 300-1 may communicate with the external device through the first signal channel P1. The first signal channel P1 may be configured to include the second signal redistributed layer patterns 600-1, the first inner connectors 170-1, the package substrate 100, and first outer connectors 190-1 of the outer connectors 190. The first and second semiconductor chips 300-1 and 300-2 may communicate with the external device through respective ones of the first and second signal channels P1 and P2 which are independently and separately provided.

Figure 10:
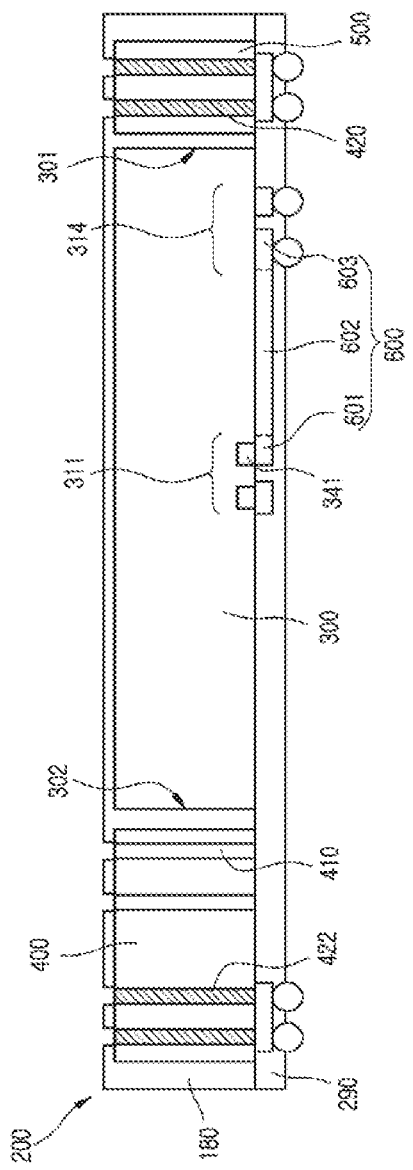
FIGS. 10 and 11 are cross-sectional views illustrating a sub-package included in a stack package according to an embodiment.
Figure 11:
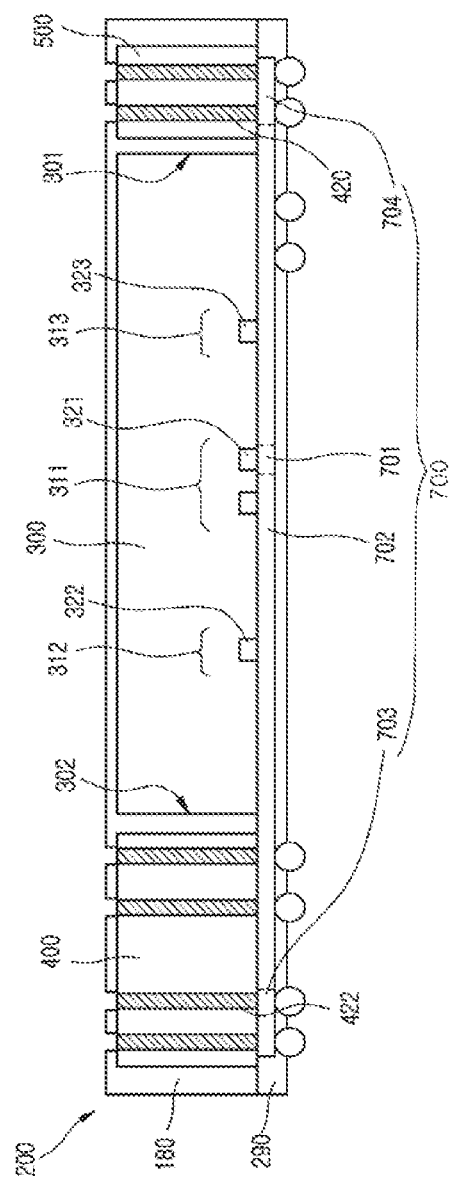

FIGS. 10 and 11 are cross-sectional views illustrating a sub-package 200 according to an embodiment. FIG. 10 is a cross-sectional view taken along an extension direction of signal redistributed layer patterns 600 included in the sub-package 200. FIG. 11 is a cross-sectional view taken along an extension direction of power redistributed layer patterns 700 included in the sub-package 200.

Referring to FIGS. 10 and 11, the sub-package 200 may be used as the first and second sub-packages 200-1 and 200-2 constituting the stack package 10 of FIG. 1. The sub-package 200 may be a unit module including two sub-packages which are vertically stacked. In such a case, each of the two stacked sub-packages may have the same configuration as the sub-package 200.

In an embodiment, the sub-package 200 may have substantially the same configuration as the first sub-package 200-1. In an embodiment, the sub-package 200 may have substantially the same configuration as the second sub-package 200-2.

The sub-package 200 may be configured to include a semiconductor chip 300, a first interposer bridge 400, a second interposer bridge 500, an encapsulant 180, signal redistributed layer patterns 600, power redistributed layer patterns 700, and a dielectric layer 290. The semiconductor chip 300, the first interposer bridge 400, the second interposer bridge 500, the encapsulant 180, the signal redistributed layer patterns 600, the power redistributed layer patterns 700, and the dielectric layer 290 may correspond to the first semiconductor chip 300-1, the first interposer bridge 400-1, the second interposer bridge 500-1, the first encapsulant 180-1, the second signal redistributed layer patterns 600-1, the second power redistributed layer patterns 700-1, and the first dielectric layer 290-1 illustrated in FIGS. 1 and 2. In an embodiment, the semiconductor chip 300, the first interposer bridge 400, the second interposer bridge 500, the encapsulant 180, the signal redistributed layer patterns 600, the power redistributed layer patterns 700, and the dielectric layer 290 may correspond to the second semiconductor chip 300-2, the third interposer bridge 400-2, the fourth interposer bridge 500-2, the second encapsulant 180-2, the first signal redistributed layer patterns 600-2, the first power redistributed layer patterns 700-1, and the second dielectric layer 290-2 illustrated in FIGS. 1 and 2.

The semiconductor chip 300 may have a first edge 301 facing the second interposer bridge 500 and a second edge 302 facing the first interposer bridge 400. A first region 311 may be located between the first edge 301 and the second edge 302, and a connection region 314 may be located between the first region 311 and the first edge 301. A second region 312 may be located between the first region 311 and the second edge 302, and a third region 313 may be located between the first region 311 and the first edge 301. First power pads 321 and signal pads 341 may be disposed on the first region 311. Second power pads 322 may be disposed on the second region 312. Third power pads 323 may be disposed on the third region 313.

The first interposer bridge 400 may be configured to include signal through vias 410 and second power through vias 422. A distance between an array of the second power through vias 422 and the semiconductor chip 300 may be greater than a distance between an array of the signal through vias 410 and the semiconductor chip 300. The second interposer bridge 500 may be configured to include first power through vias 420.

Each of the signal redistributed layer patterns 600 may be a conductive pattern including a pad overlap part 601, a signal connection part 603, and an extension part 602. The signal redistributed layer patterns 600 may extend from the first region 311 onto the connection region 314 to electrically connect the signal connection parts 603 of the signal redistributed layer patterns 600 to respective ones of the signal pads 341.

Each of the power redistributed layer patterns 700 may be a conductive pattern including a pad overlap part 701, a first power connection part 703, a second power connection part 704, and an extension part 702. The first power connection parts 703 of the power redistributed layer patterns 700 may be electrically connected to the second power through vias 422 and may be located to overlap with the second power through vias 422. The second power connection parts 704 of the power redistributed layer patterns 700 may be electrically connected to the first power through vias 420 and may be located to overlap with the first power through vias 420. The power redistributed layer patterns 700 may electrically connect the first power pads 321 to the second and third power pads 322 and 323 and may also extend to electrically connect the first power pads 321 to the first and second power connection parts 703 and 704. The power redistributed layer patterns 700 may extend from the first region 311 to pass over the first and second edges 301 and 302 and to reach the first and second power connection parts 703 and 704.

Figure 12:
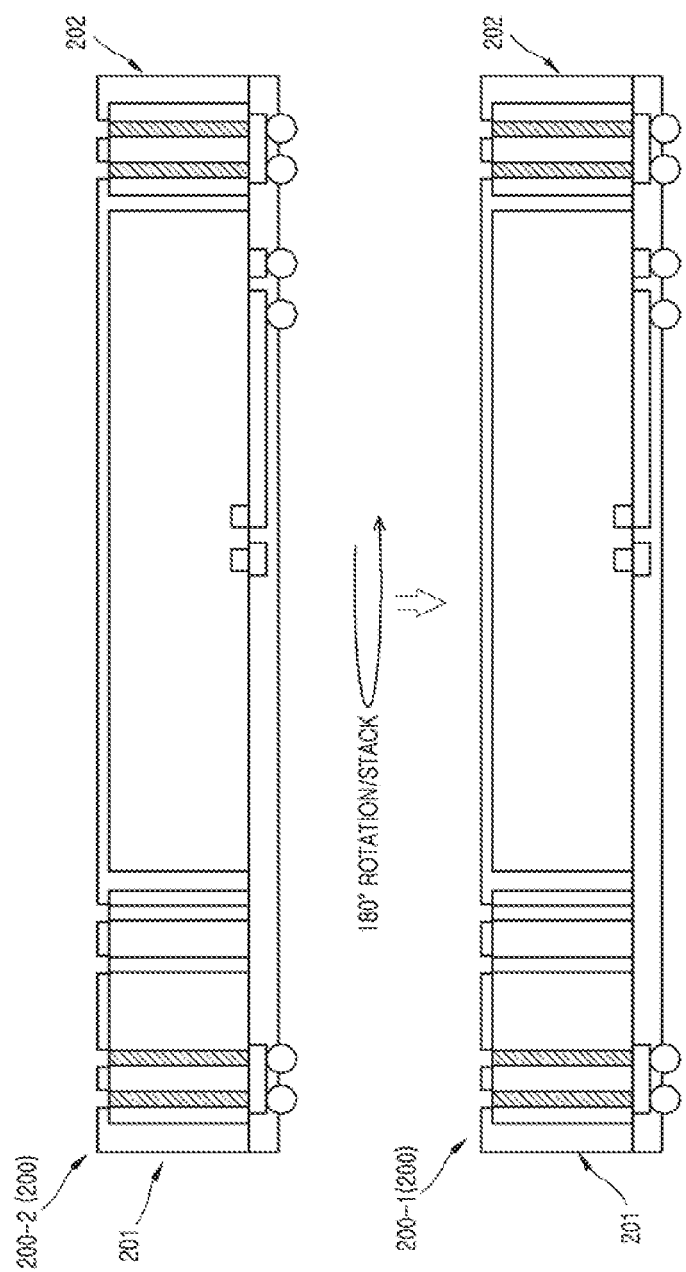
FIG. 12 illustrates a process for stacking sub-packages included in a stack package according to an embodiment.

FIG. 12 illustrates a process for stacking the sub-packages 200 according to an embodiment.

Referring to FIG. 12, the first and second sub-packages 200-1 and 200-2 having the same configuration as the sub-package 200 may be provided. The second sub-package 200-2 may be rotated by 180 degrees with respect to the first sub-package 200-1, and the rotated second sub-package 200-2 may be stacked on the first sub-package 200-1. In such a case, the second sub-package 200-2 may be rotated by 180 degrees such that a second edge 202 of the second sub-package 200-2 is vertically aligned with a first edge 201 of the first sub-package 200-1. The first edge 201 and the second edge 202 of each of the sub-packages 200 may be opposite to each other or may face each other. The stack package 10 illustrated in FIGS. 1 and 2 may be fabricated using the rotating and stacking processes described above.

Figure 13:
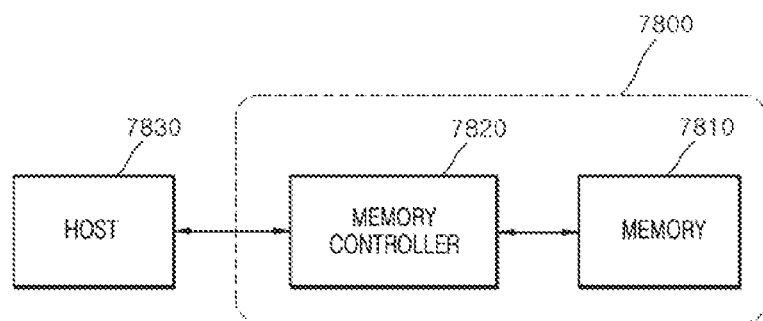
FIG. 13 is a block diagram illustrating an electronic system employing a memory card including at least one of stack packages according to the embodiments.

FIG. 13 is a block diagram illustrating an electronic system including a memory card 7800 employing at least one of the stack packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the stack packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 14:
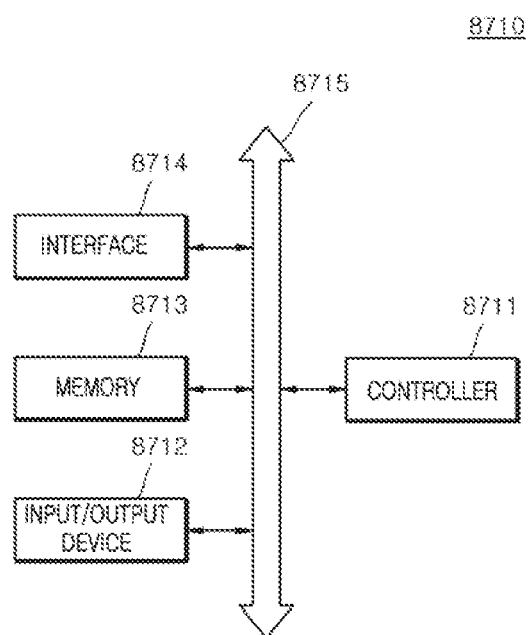
FIG. 14 is a block diagram illustrating another electronic system including at least one of stack packages according to the embodiments.

FIG. 14 is a block diagram illustrating an electronic system 8710 including at least one of the stack packages according to the embodiments. The electronic system 8710 may include a controller 8711, an input/output unit 8712, and a memory 8713. The controller 8711, the input/output unit 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the stack packages according to the embodiments of the present disclosure. The input/output unit 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts are not limited to the above descriptions but defined by the accompanying claims, and all of distinctive features in the equivalent scope should be construed as being included.

What is claimed is:

1. A stack package comprising:
    a first sub-package disposed on a package substrate; and
    a second sub-package vertically stacked on the first sub-package,
    wherein the first sub-package comprises:
        a first semiconductor chip;
        a first interposer bridge disposed to be laterally spaced apart from the first semiconductor chip and including a first signal through via; and
        a second interposer bridge disposed at one side of the first semiconductor chip opposite to the first interposer bridge and including a first power through via, and
    wherein the second sub-package comprises:
        a second semiconductor chip;
        a first signal redistributed layer pattern including a first signal connection part that is electrically connected to the first signal through via and is located to overlap with the first signal through via; and
        a first power redistributed layer pattern including a first power connection part that is electrically connected to the first power through via and is located to overlap with the first power through via.

2. The stack package of claim 1, wherein the second semiconductor chip comprises:
    a first edge located to overlap with the first interposer bridge;
    a second edge located at an opposite side of the first edge;

a first region located between the first edge and the second edge;

a first connection region which is located between the first region and the first edge and on which the first signal connection part is disposed; and a first power pad and a first signal pad disposed on the first region, wherein the first signal redistributed layer pattern extends from the first region onto the first connection region to electrically connect the first signal connection part to the first signal pad, and wherein the first power redistributed layer pattern extends from the first region past the second edge to the first power connection part to electrically connect the first power pad to the first power connection part.

3. The stack package of claim 2, wherein the second semiconductor chip further includes:

a second region located between the first region and the second edge; and a second power pad disposed on the second region, wherein the first power redistributed layer pattern farther extends to electrically connect the first power pad to the second power pad.

4. The stack package of claim 2, wherein the second semiconductor chip further includes:

a third region located between the first region and the first edge; and a third power pad disposed on the third region, wherein the first power redistributed layer pattern farther extends from the first region toward the first edge to electrically connect the first and second power pads to the third power pad.

5. The stack package of claim 4, wherein the first interposer bridge further includes a second power through via located farther from the first semiconductor chip than the first signal through via is located from the first semiconductor chip such that a distance between the first semiconductor chip and the second power through via is greater than the first semiconductor chip and the first signal through via;

wherein the first power redistributed layer pattern farther extends to pass over the first edge of the second semiconductor chip and includes a second power connection part that is located outside a region overlapping with the second semiconductor chip and is located within a region overlapping with the second power through via; and wherein the second power connection part is connected to the second power through via.

6. The stack package of claim 5, wherein the first interposer bridge further includes a third power through via adjacent to the second power through via; and wherein the third power through via is electrically connected to the second power through via by the second power connection part.

7. The stack package of claim 5, wherein the first semiconductor chip includes:

a third edge facing the second interposer bridge;

a fourth edge facing the first interposer bridge;

a fourth region located between the third and fourth edges;

a second connection region located between the fourth region and the third edge; and a fourth power pad and a second signal pad disposed on the fourth region, and wherein the first sub-package further includes:

a second signal redistributed layer pattern configured to include a second signal connection part located on the second connection region and configured to electrically connect the second signal pad to the second signal connection part; and a second power redistributed layer pattern configured to include a third power connection part located to overlap with the second power through via of the first interposer bridge and configured to extend from the fourth region to the third power connection part through a region on the fourth edge to electrically connect the fourth power pad to the third power connection part.

8. The stack package of claim 7, wherein the first semiconductor chip further includes:

a fifth region located between the fourth region and the fourth edge;

a sixth region located between the fourth region and the third edge;

a fifth power pad disposed on the fifth region; and a sixth power pad disposed on the sixth region, wherein the second power redistributed layer pattern farther extends to pass over the fifth and sixth regions such that the fourth power pad is electrically connected to the fifth and sixth power pads and is electrically connected to the first power through via of the second interposer bridge.

9. The stack package of claim 1, wherein the first power redistributed layer pattern extends to pass over the second edge of the second semiconductor chip such that the first power connection part is located outside a region overlapping with the second semiconductor chip to be located adjacent to the second edge.

10. The stack package of claim 1, wherein the first power redistributed layer pattern extends to have a length which is greater than a length of the first signal redistributed layer pattern.

11. The stack package of claim 10, wherein the first power redistributed layer pattern includes a portion having a width which is greater than a width of the first signal redistributed layer pattern.

12. The stack package of claim 1, wherein the second semiconductor chip comprises:

a first edge located to overlap with the first interposer bridge; and a second edge located at an opposite side of the first edge; and wherein the second edge of the second semiconductor chip is located to overlap with the first semiconductor chip.

13. The stack package of claim 1, wherein the first sub-package further includes a first encapsulant covering the first semiconductor chip and the first and second interposer bridges;

wherein the second sub-package further includes a second encapsulant covering the second semiconductor chip; and wherein the stack package further includes a third encapsulant covering the first and second sub-packages.

14. A stack package comprising:

a first sub-package disposed on a package substrate; and a second sub-package vertically stacked on the first sub-package, wherein the first and second sub-packages comprise:

a semiconductor chip;

a first interposer bridge disposed to be laterally spaced apart from the semiconductor chip and including a signal through via and a second power through via;

a second interposer bridge disposed at one side of the semiconductor chip opposite to the first interposer bridge and including a first power through via;

a signal redistributed layer pattern including a signal connection part that is electrically connected to the signal through via and is located to overlap with the signal through via; and a power redistributed layer pattern including a first power connection part that is electrically connected to the second power through via and is located to overlap with the second power through via and including a second power connection part that is electrically connected to the first power through via and is located to overlap with the first power through via, wherein the semiconductor chip comprises:
 a first edge facing the second interposer bridge;
 a second edge facing the first interposer bridge;
 a first region located between the first and second edges;
 a connection region located between the first region and the first edge;
 a first power pad and a signal pad disposed on the first region;
 a second region located between the first region and the second edge; and
 a second power pad disposed on the second region, wherein the signal redistributed layer pattern extends from the first region onto the connection region to electrically connect the signal pad to the signal connection part, wherein the power redistributed layer pattern extends from the first region past the first and second edges to the first and second power connection parts to electrically connect the first power pad to the second power pad as well as the first and second power connection parts, wherein the second sub-package is rotated relative to the first sub-package and the rotated second sub-package is stacked on the first sub-package such that the signal connection part of the second sub-package overlaps with the signal through via of the first sub-package and the first power connection part of the second sub-package overlaps with the first power through via of the first sub-package.

15. The stack package of claim 14, wherein the first and second sub-packages have the same configuration.

16. The stack package of claim 14, wherein the semiconductor chip further includes:
 a third region located between the first region and the first edge; and
 a third power pad disposed on the third region, wherein the power redistributed layer pattern farther extends to electrically connect the first and second power pads to the third power pad.

17. The stack package of claim 16,
wherein the first interposer bridge further includes a third power through via located to be adjacent to the second power through via; and
wherein the third power through via is electrically connected to the second power through via by the first power connection part.

18. The stack package of claim 14, wherein the power redistributed layer pattern extends to have a length which is greater than a length of the signal redistributed layer pattern.

19. The stack package of claim 18, wherein the power redistributed layer pattern includes a portion having a width which is greater than a width of the signal redistributed layer pattern.

20. A stack package comprising:
 a first sub-package disposed on a package substrate; and
 a second sub-package vertically stacked on the first sub-package, wherein the first and second sub-packages comprise:
 a semiconductor chip including a power pad and a signal pad;
 a first interposer bridge disposed to be laterally spaced apart from the semiconductor chip and including a signal through via and a second power through via;
 a second interposer bridge disposed at one side of the semiconductor chip opposite to the first interposer bridge and including a first power through via;
 a signal redistributed layer pattern including a signal connection part that is electrically connected to the signal through via and is located to overlap with the signal through via and extending to electrically connect the signal pad to the signal connection part; and
 a power redistributed layer pattern including a first power connection part that is electrically connected to the second power through via and is located to overlap with the second power through via, including a second power connection part that is electrically connected to the first power through via and is located to overlap with the first power through via, and extending to electrically connect the power pad to the first and second power connection parts, wherein the second sub-package is rotated relative to the first sub-package and the rotated second sub-package is stacked on the first sub-package such that the signal connection part of the second sub-package overlaps with the signal through via of the first sub-package and the first power connection part of the second sub-package overlaps with the first power through via of the first sub-package.

* * * * *